(12) United States Patent
Shoji

(10) Patent No.: US 7,009,166 B2
(45) Date of Patent: Mar. 7, 2006

(54) PHOTOCOUPLER, METHOD FOR PRODUCING THE SAME, AND ELECTRONIC DEVICE EQUIPPED WITH THE PHOTOCOUPLER

(75) Inventor: Hiroyuki Shoji, Takaichi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 207 days.

(21) Appl. No.: 10/396,379

(22) Filed: Mar. 26, 2003

(65) Prior Publication Data

US 2003/0222205 A1      Dec. 4, 2003

(30) Foreign Application Priority Data

Mar. 26, 2002  (JP)   .............. 2002-086471

(51) Int. Cl.
*H01J 40/14*      (2006.01)
*G02B 27/00*      (2006.01)

(52) U.S. Cl. .................. 250/214 R; 250/551; 257/82; 257/99

(58) Field of Classification Search .......... 250/214 R, 250/551; 257/80–83, 98–100, 432–433
See application file for complete search history.

(56) References Cited

U.S. PATENT DOCUMENTS 4,114,177 A * 9/1978 King ........................ 257/81
4,160,308 A * 7/1979 Courtney et al. ............ 438/25
5,148,243 A * 9/1992 Merrick et al. .............. 257/81
5,340,993 A * 8/1994 Salina et al. ................ 250/551
6,588,946 B1 * 7/2003 Mitsui ........................ 385/92

FOREIGN PATENT DOCUMENTS

| JP | 60092637 A | * | 5/1985 |
|---|---|---|---|
| JP | 62-105458 A | | 5/1987 |
| JP | 62156882 A | * | 7/1987 |
| JP | 63053984 A | * | 3/1988 |
| JP | 05136452 A | * | 6/1993 |
| JP | 2787387 B2 | | 6/1998 |
| JP | 11-8404 A | | 1/1999 |
| JP | 11008404 A | * | 1/1999 |
| JP | 2001-148504 A | | 5/2001 |

* cited by examiner

*Primary Examiner*—David Porta
*Assistant Examiner*—Suezu Ellis
(74) *Attorney, Agent, or Firm*—Birch, Stewart, Kolasch & Birch, LLP

(57) ABSTRACT

A photocoupler comprises a light emitting element and a light detecting element which are both mounted on lead frames. The light emitting element and the light detecting element are enclosed in a transparent resin 19, such that the transparent resin can serve as an optical path between the light emitting element and the light detecting element. A retention frame is disposed around the light emitting element and the light detecting element to hold a low-viscosity resin. Also an electronic device includes a photocoupler.

11 Claims, 13 Drawing Sheets

Prior Art

PHOTOCOUPLER, METHOD FOR PRODUCING THE SAME, AND ELECTRONIC DEVICE EQUIPPED WITH THE PHOTOCOUPLER

BACKGROUND OF THE INVENTION

1. Field of the Invention

The present invention relates to a photocoupler, a method for producing the same, and an electronic device equipped with the photocoupler.

2. Related Art

A photocoupler has a light emitting element and a light detecting element in an opposed arrangement. In this photocoupler, electric signals are converted into optical signals by the light emitting element. Then, the optical signals are transmitted from the light emitting element to the light detecting element, where the optical signals are converted into electric signals. The input side and the output side of this photocoupler are electrically insulated.

FIG. 12 shows an example of a conventional flat type photocoupler. FIG. 13 is a flowchart showing the process for producing the flat type photocoupler. According to this production process, a light emitting element 302 and a light detecting element 303 are respectively attached to lead frames 304, 305 by a conductive adhesive 306 (STEP. 401) In the next wire bonding step, the light emitting element 302 and the light detecting element 303 are electrically connected to the lead frames 304, 305, respectively (STEP. 402) Then, a transparent resin 307 is formed to provide an optical path between the light emitting element 302 and the light detecting element 303 (STEP. 403). Thereafter, a light blocking resin 308 is molded in order to avoid penetration of extraneous light and leakage of internal light (STEP. 404). An exterior wall of the molded light blocking resin 308 is plated (STEP. 405) to finish a photocoupler 301. This photocoupler 301 is tested for withstand voltage (STEP. 406), electric characteristics (STEP. 407) and appearance (STEP. 408). Having passed these tests, the photocoupler 301 is packed (STEP. 409) and shipped (STEP. 410).

In this photocoupler 301, when light emits from the light emitting element 302, the light is reflected at the interior wall of the transparent resin 307, thereby being incident on the light detecting element 303.

FIG. 14 shows an example of a conventional face-to-face type photocoupler. FIG. 15 is a flowchart showing the process for producing the face-to-face type photocoupler. According to this production process, a light emitting element 502 is attached to a lead frame 504 by a conductive adhesive 505 (STEP. 601) and electrically connected to the lead frame 504 by wire bonding (STEP. 602). Likewise, a light detecting element 503 is attached to a lead frame 506 by a conductive adhesive 505 (STEP. 603) and electrically connected to the lead frame 506 by wire bonding (STEP. 604). Then, the lead frames 504, 506 are positioned such that the light emitting element 502 and the light detecting element 503 are opposed to each other (STEP. 605). In this opposed state, a transparent resin 507 is formed to provide an optical path between the light emitting element 502 and the light detecting element 503 (STEP. 606) Thereafter, a light blocking resin 508 is molded in order to avoid penetration of extraneous light and leakage of internal light (STEP. 607). An exterior wall of the molded light blocking resin 508 is plated (STEP. 608) to finish a photocoupler 501. This photocoupler 501 is tested for withstand voltage (STEP. 609), electric characteristics (STEP. 610) and appearance (STEP. 611). Having passed these tests, the photocoupler 501 is packed (STEP. 612) and shipped (STEP. 613).

In this photocoupler 501, when light emits from the light emitting element 502, the light is transmitted straight through the transparent resin 507 to the light detecting element 503.

Incidentally, both types of conventional photocouplers employ a silicone resin as the transparent resin which serves as an optical path between the light emitting element and the light detecting element. A silicone resin, however, has a low viscosity in an unhardened state. Therefore, if applied too much, the silicone resin may flow along the reverse surface or terminals of a lead frame. In the worst case, the silicone resin leaks beyond the light blocking resin, degrading a photocoupler to a defective one. On the other hand, if applied too little, the silicone resin cannot provide an optical path between the light emitting element and the light detecting element, also degrading a photocoupler to a defective one. Thus, as far as the conventional techniques are concerned, it is very troublesome to control the amount of silicone resin to be applied, and extremely difficult to stabilize the characterisetics and quality of a photocoupler.

SUMMARY OF THE INVENTION

The present invention is made in view of the above-mentioned problems. An object of the invention is to provide a photocoupler and a method for producing the same, in which an optical path between the light emitting element and the light detecting element can be easily provided by a transparent resin and in which the characteristics and quality of the photocoupler can be stabilized, and also to provide an electronic device equipped with the photocoupler.

In order to achieve the above objects, a photocoupler of the present invention comprises a light emitting element and a light detecting element which are both mounted on the same surface of a lead frame and enclosed in a transparent resin such that the transparent resin serves as an optical transmission path between the light emitting element and the light detecting element. The photocoupler is equipped with a retention frame for holding the transparent resin, the retention frame being disposed around the light emitting element and the light detecting element.

According to this structure, when the transparent resin is applied to the interior of the retention frame, the transparent resin encloses the light emitting element and the light detecting element and can serve as an optical transmission path between these elements. Concerning the application of a transparent resin, the retention frame holds an un-hardened transparent resin even if the resin is in a low-viscosity state. Thereby, the retention frame can prevent the resin from flowing along the reverse side or terminals of the lead frame beyond the retention frame. As a consequence, an optical path between the light emitting element and the light detecting element can be easily made of a transparent resin, and the characteristics and quality of the photocoupler can be stabilized.

In this structure, the retention frame may be made of a thermoplastic resin.

Such a thermoplastic resin may be a PPS (polyphenylene sulfide), PC (polycarbonate), PBT (polybutylene terephthalate), crystalline polymer, amorphous polymer, liquid crystal polymer, or the like. Use of this thermoplastic resin can hamper development of flashes on the retention frame, thereby eliminating a cause for defective products.

Moreover, the retention frame may be made of a light-reflective insulating resin and may have a reflective or mirror-like wall.

If the retention frame has a reflective or mirror-like wall, light from the light emitting element is reflected at the wall of the retention frame. Accordingly, it is possible to increase the amount of light detected by the light detecting element and to enhance the light transmission efficiency.

Preferably, the retention frame has a shoulder for preventing outflow of the transparent resin which is in a low-viscosity state.

In this structure, the retention frame can effectively prevent outflow of the low-viscosity transparent resin.

According to the present invention, a photocoupler of a different structure comprises a light emitting element and a light detecting element which are mounted on separate lead frames, positioned in an opposed manner in the mounted state, and enclosed in a transparent resin such that the transparent resin serves as an optical transmission path between the light emitting element and the light detecting element. In this photocoupler, the lead frames are equipped with a pair of retention frames for holding the transparent resin, one of the retention frames being disposed around the light emitting element and the other retention frame being disposed around the light detecting element. The retention frames are located in a package and can have a horizontal portion and a vertical portion extending therefrom.

This photocoupler is based on the structure where the light emitting element and the light detecting element are positioned in an opposed manner. Concerning this structure, the lead frames are equipped with a pair of retention frames, one of which is disposed around the light emitting element and the other of which is disposed around the light detecting element. When an unhardened transparent resin is applied to the interior of these retention frames, the retention frames can prevent the low-viscosity transparent resin from flowing along the reverse side or terminals of the lead frames.

In this structure, each of the retention frames may be made of a thermoplastic resin.

Regarding the material for the retention frames, use of a thermoplastic resin can hamper development of flashes on the retention frames, thereby eliminating a cause for defective products.

Preferably, each of the retention frames is made of a light-reflective insulating resin and has a reflective or mirror-like wall.

This structure allows light from the light emitting element to be reflected at the walls of the retention frames. Accordingly, it is possible to increase the amount of light detected by the light detecting element and to enhance the light transmission efficiency.

Further, the retention frames may be L-shaped and surround the light emitting element and the light detecting element in a virtual rectangle.

The L-shaped retention frames can surround the light emitting element and the light detecting element in a virtual rectangle.

Additionally, a transparent sheet may be interposed between the light emitting element and the light detecting element, and may be supported by either of the retention frames.

This transparent sheet, if conductive, can suppress generation of noise (can enhance the noise resistance). Besides, if insulative, the sheet can enhance the insulation between the light emitting element and the light detecting element.

Next, the present invention provides a method for producing a photocoupler in which a light emitting element and a light detecting element are both mounted on the same surface of a lead frame and enclosed in a transparent resin such that the transparent resin serves as an optical transmission path between the light emitting element and the light detecting element. This method comprises the steps of: first, providing the lead frame with a retention frame made of a transparent resin; then, mounting the light emitting element and the light detecting element on the lead frame, and disposing the retention frame around the light emitting element and the light detecting element which are in the mounted state; and subsequently applying the former transparent resin to an interior of the retention frame.

The present invention also provides another method for producing a photocoupler in which a light emitting element and a light detecting element are mounted on separate lead frames, positioned in an opposed manner in the mounted state, and enclosed in a transparent resin such that the transparent resin serves as an optical transmission path between the light emitting element and the light detecting element. The method comprises the steps of: first, providing the lead frames with a pair of retention frames made of a transparent resin; then, mounting the light emitting element and the light detecting element one by one on the lead frames, and disposing one of the retention frames around the light emitting element and the other retention frame around the light detecting element; and subsequently applying the former transparent resin to an interior of each retention frame.

According to these production methods of the present invention, each lead frame is equipped with a retention frame for holding a transparent resin, before the light emitting element and the light detecting element are mounted on the same lead frame or the separate lead frames. In this case, each retention frame can be attached to the corresponding lead frame, without imposing a thermal or mechanical stress on the light emitting element, the light detecting element, and wires therefor. Hence, it is possible to eliminate a cause for detective products. Further, concerning the application of a transparent resin, the retention frame or frames can prevent outflow of the transparent resin even if the resin is in a low-viscosity state.

Furthermore, an electronic device of the present invention comprises a photocoupler according to the present invention.

Namely, the present invention is not limited to a photocoupler and its production method, but encompasses an electronic device equipped with this photocoupler. Examples of such electronic devices are a power source, a programming console, etc.

DESCRIPTION OF THE PREFERRED EMBODIMENTS

Referring to the attached drawings, embodiments of the present invention are hereinafter described in detail.

Figure 1:
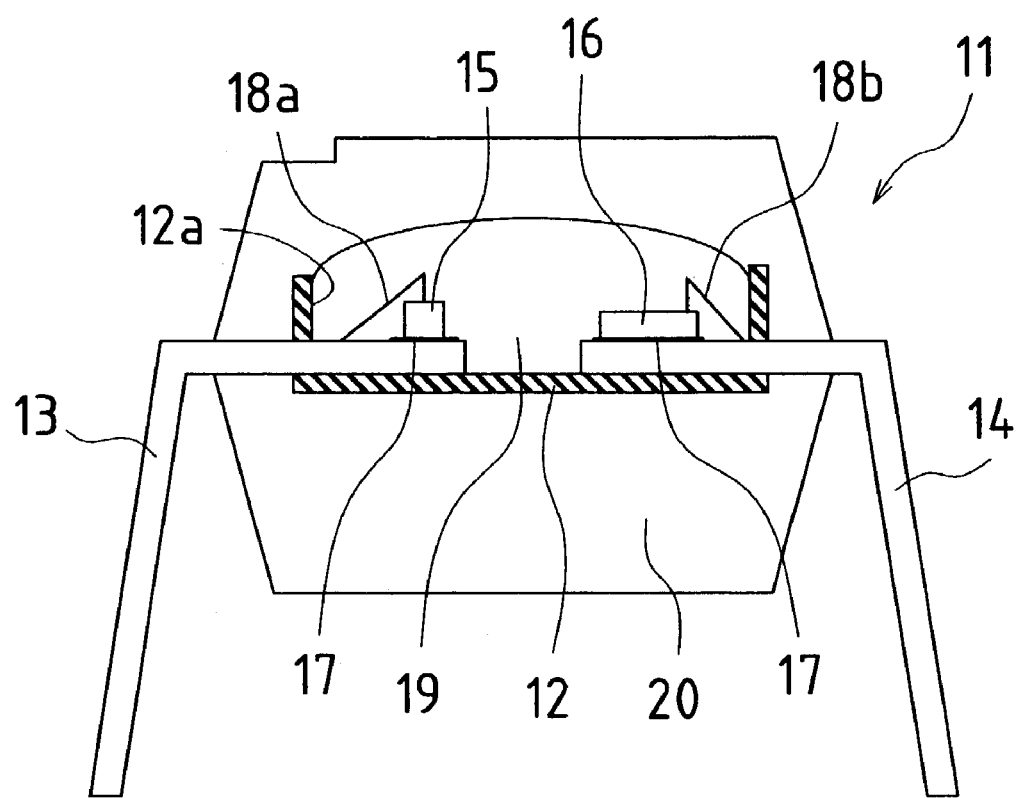
FIG. 1 is a sectional view showing a flat type photocoupler according to the first embodiment of the present invention.
Figure 2:
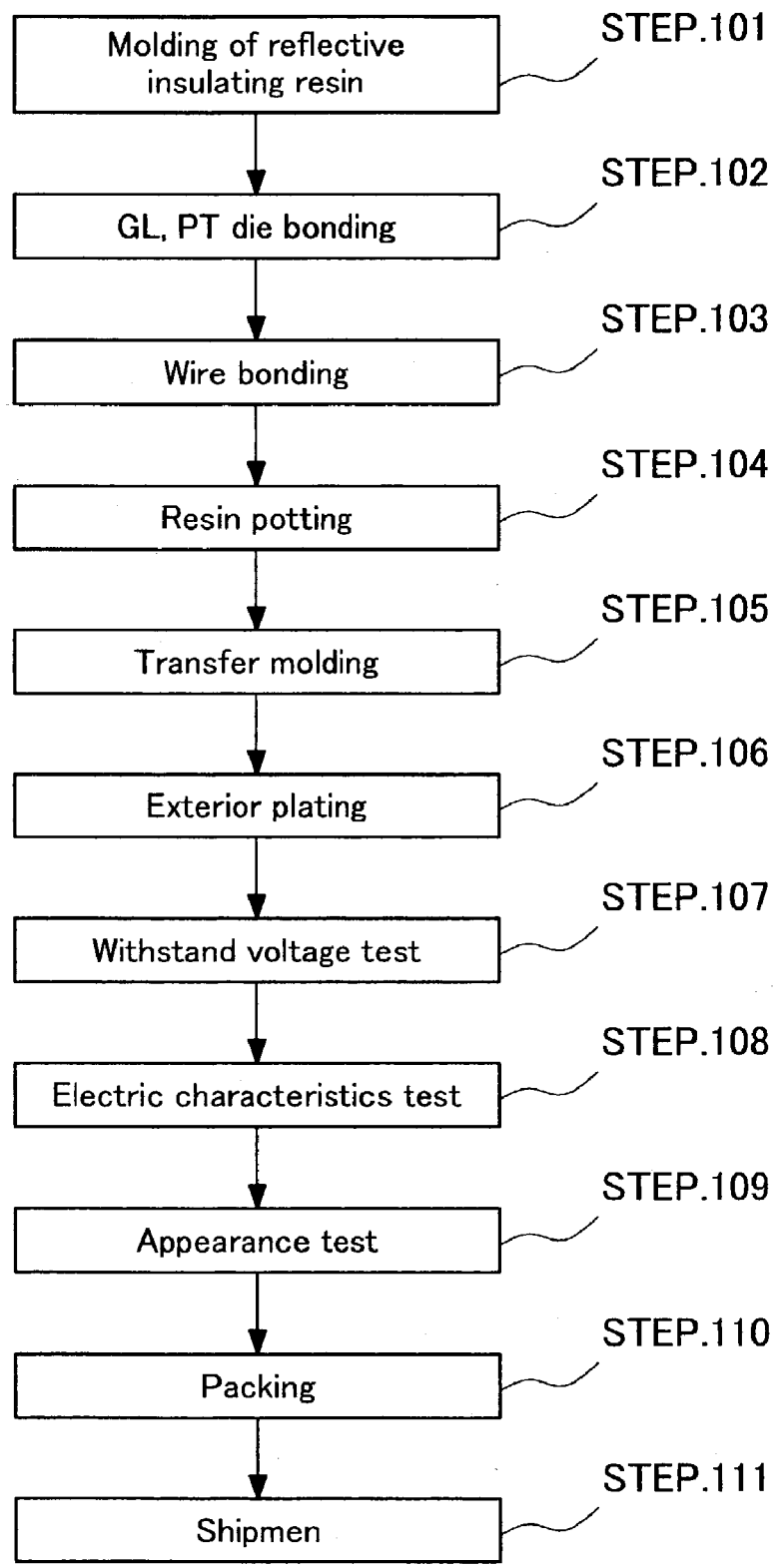
FIG. 2 is a flowchart showing a production process for the photocoupler shown in FIG. 1.

FIG. 1 is a sectional view showing a flat type photocoupler according to the first embodiment of the present invention. FIG. 2 is a flowchart showing a production process for the photocoupler of this embodiment.

Figure 3:
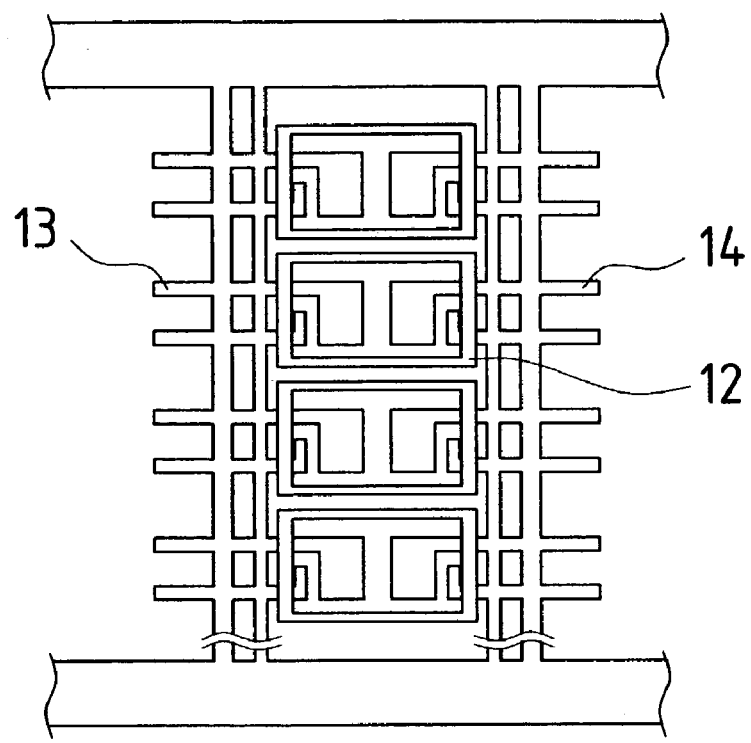
FIG. 3 is a plan view showing retention frames and lead frames for the photocoupler shown in FIG. 1.
Figure 4:
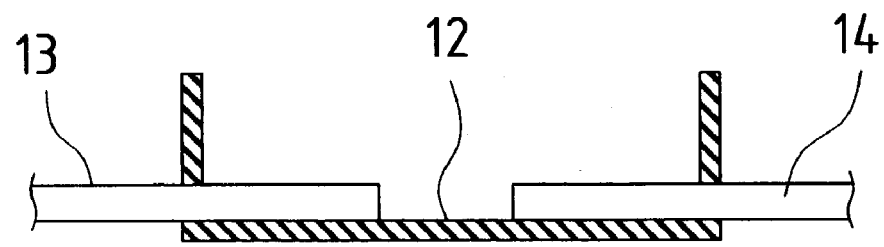
FIG. 4 is an enlarged side view of a retention frame and lead frames shown in FIG. 3.

To start with, a retention frame 12 is molded from a light-reflective insulating resin and is attached to lead frames 13, 14, as shown in FIG. 3 and FIG. 4 (STEP. 101). The retention frame 12 may be built into the lead frames 13, 14 during its molding process; otherwise, the retention frame 12 may be prepared in advance and attached later. For this embodiment, a plurality of retention frames 12 are molded in advance and attached later. When the retention frame 12 is molded from a light-reflective insulating resin, the wall 12a of the retention frame 12 may be smoothed and mirror finished. As the insulating resin for the retention frame 12, this embodiment adopts a thermoplastic resin such as a PPS (polyphenylene sulfide), PC (polycarbonate), PBT (polybutylene terephthalate), crystalline polymer, amorphous polymer or liquid crystal polymer. Use of this thermoplastic resin hampers development of flashes on the retention frame 12, thereby eliminating a cause for defective products.

Then, a light emitting element 15 and a light detecting element 16 are attached to the lead frames 13, 14 by a conductive adhesive 17 (STEP. 102). In the next wire bonding step, the light emitting element 15 and the light detecting element 16 are electrically connected to the lead frames 13, 14 via wires 18a, 18b, respectively (STEP. 103). The elements 15, 16 and the lead frames 13, 14 locate inside the retention frame 12.

Later, a prescribed amount of transparent resin, such as a silicone resin or an epoxy potting resin, is applied to the interior of the retention frame 12, whereby the light emitting element 15 and the light detecting element 16 are enclosed in a transparent resin 19 which serves as an optical transmission path between the light emitting element 15 and the light detecting element 16 (STEP. 104). At this stage, although an unhardened transparent resin 19 has a low viscosity, the retention frame 12 holds the transparent resin 19 and prevents it from flowing along the reverse side or terminals of the lead frames 13, 14 beyond the retention frame 12.

Thereafter, a light blocking resin 20 is molded in order to avoid penetration of extraneous light and leakage of internal light (STEP. 105). An exterior wall of the molded light blocking resin 20 is plated (STEP. 106) to finish a photocoupler 11. This photocoupler 11 is tested for withstand voltage (STEP. 107), electric characteristics (STEP. 108) and appearance (STEP. 109) Having passed these tests, the photocoupler 11 is packed (STEP. 110) and shipped (STEP. 111).

In this photocoupler 11, when light emits from the light emitting element 15, the light is reflected at the interior wall of the transparent resin 19, thereby being incident on the light detecting element 16. In addition, since the retention frame 12 is made of a light-reflective insulating resin, light emanating sideways from the light emitting element 15 is reflected at the wall 12a of the retention frame 12, thereby also being incident on the light detecting element 16. Owing to this structure, a greater amount of light is incident on the light detecting element 16, which leads to improvement in the light transmission efficiency between the light emitting element 15 and the light detecting element 16. Furthermore, if the wall 12a of the retention frame 12 is mirror finished as mentioned earlier, the reflectance at the wall 12a becomes higher. This rise in reflectance causes an additional increase in the amount of light detected by the light detecting element 16, and contributes to a further improvement in light transmission efficiency.

According to the first embodiment thus described, the transparent resin 19 is applied to the interior of the retention frame 12 and formed as an optical transmission path between the light emitting element 15 and the light detecting element 16. Throughout this process, the retention frame 12 holds an unhardened low-viscosity transparent resin 19 and prevents it from flowing along the reverse side or terminals of the lead frames 13, 14 beyond the retention frame 12. As a result, it is possible to form the transparent resin 19 easily and to stabilize the characteristics and quality of the photocoupler 11. Moreover, since a thermoplastic resin is employed as a material for the retention frame 12, the retention frame 12 is less likely to develop flashes. Eventually, it is possible to eliminate a cause for defective products.

Incidentally, the retention frame 12 is attached to the lead frames 13, 14, before the light emitting element 15 and the light detecting element 16 are mounted on the lead frames 13, 14. In this case, attachment of the retention frame 12 does not impose a thermal or mechanical stress on the elements 15, 16 and the wires 18a, 18b. This process can remove another cause for defective products.

Figure 5:
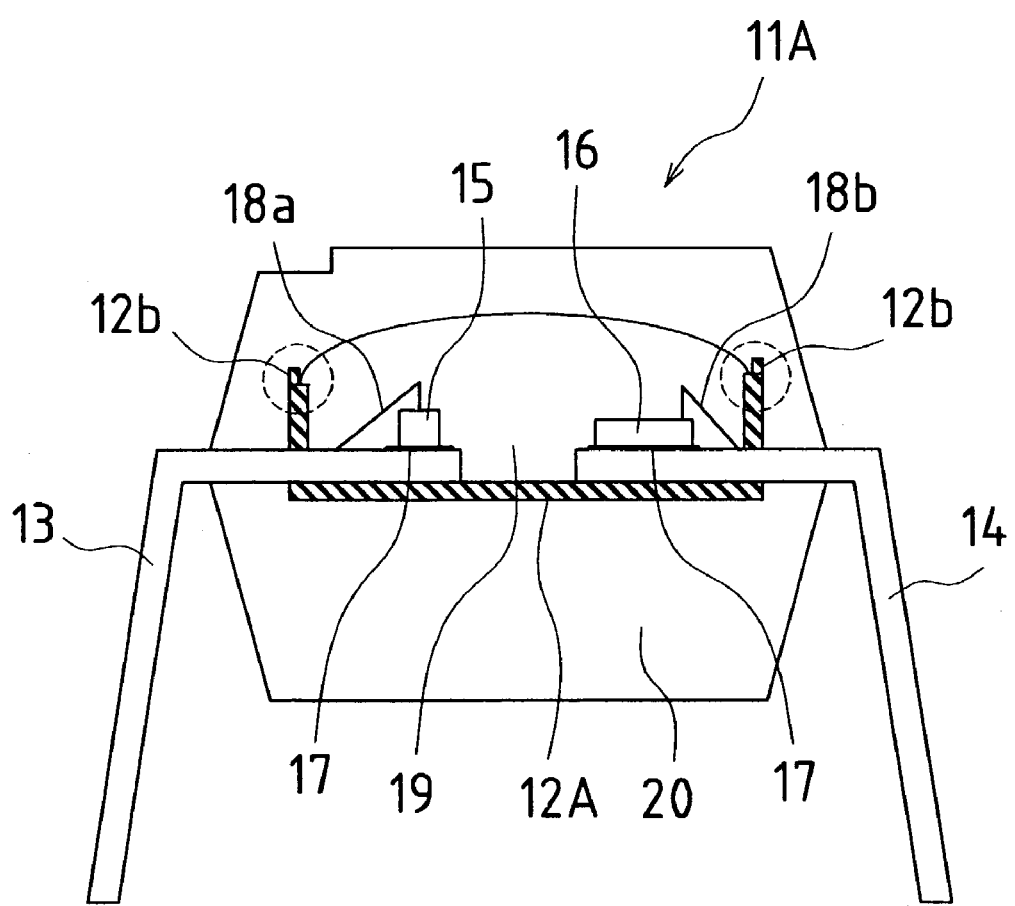
FIG. 5 is a sectional view showing a modified example of the photocoupler shown in FIG. 1.

FIG. 5 shows a modified example of the photocoupler of FIG. 1. The photocoupler 11A adopts a retention frame 12A, in place of the retention frame 12 illustrated in FIG. 1. The wall of the retention frame 12A has a shoulder 12b at the top. The shoulder 12b prevents outflow of an unhardened transparent resin 19 more effectively.

Figure 6:
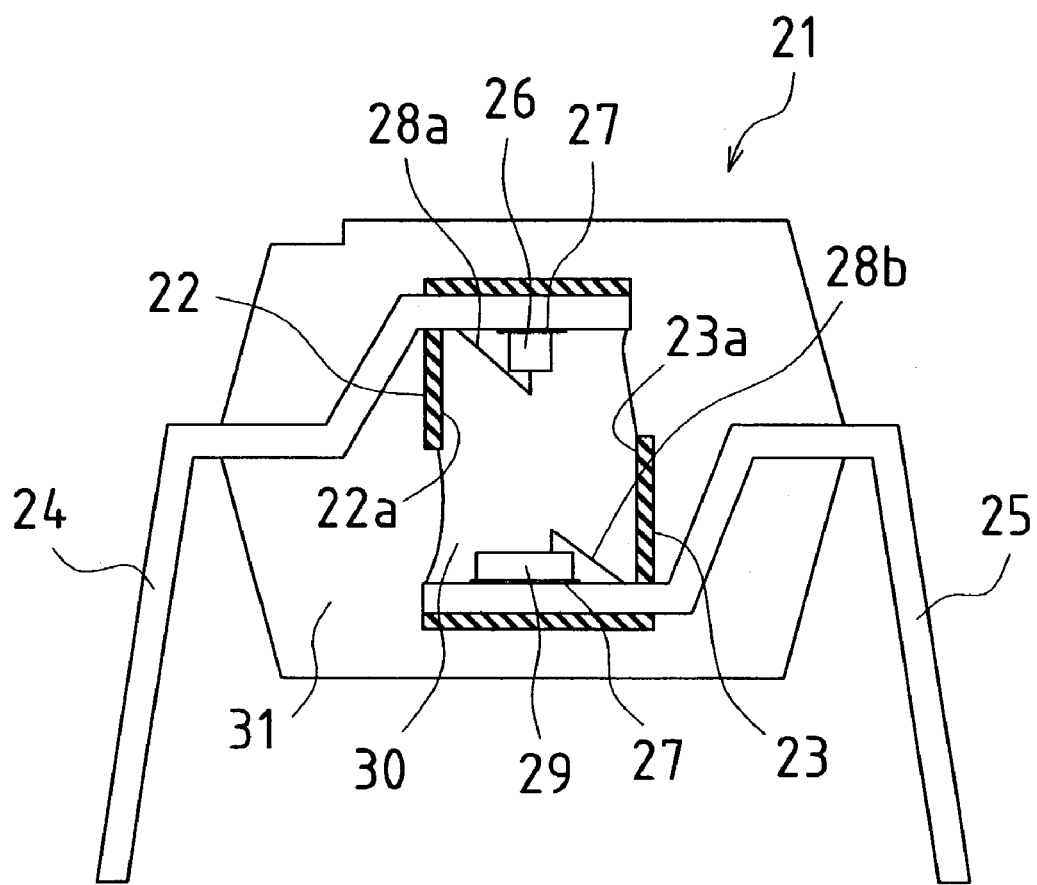
FIG. 6 is a sectional view showing a face-to-face type photocoupler according to the second embodiment of the present invention.
Figure 7:
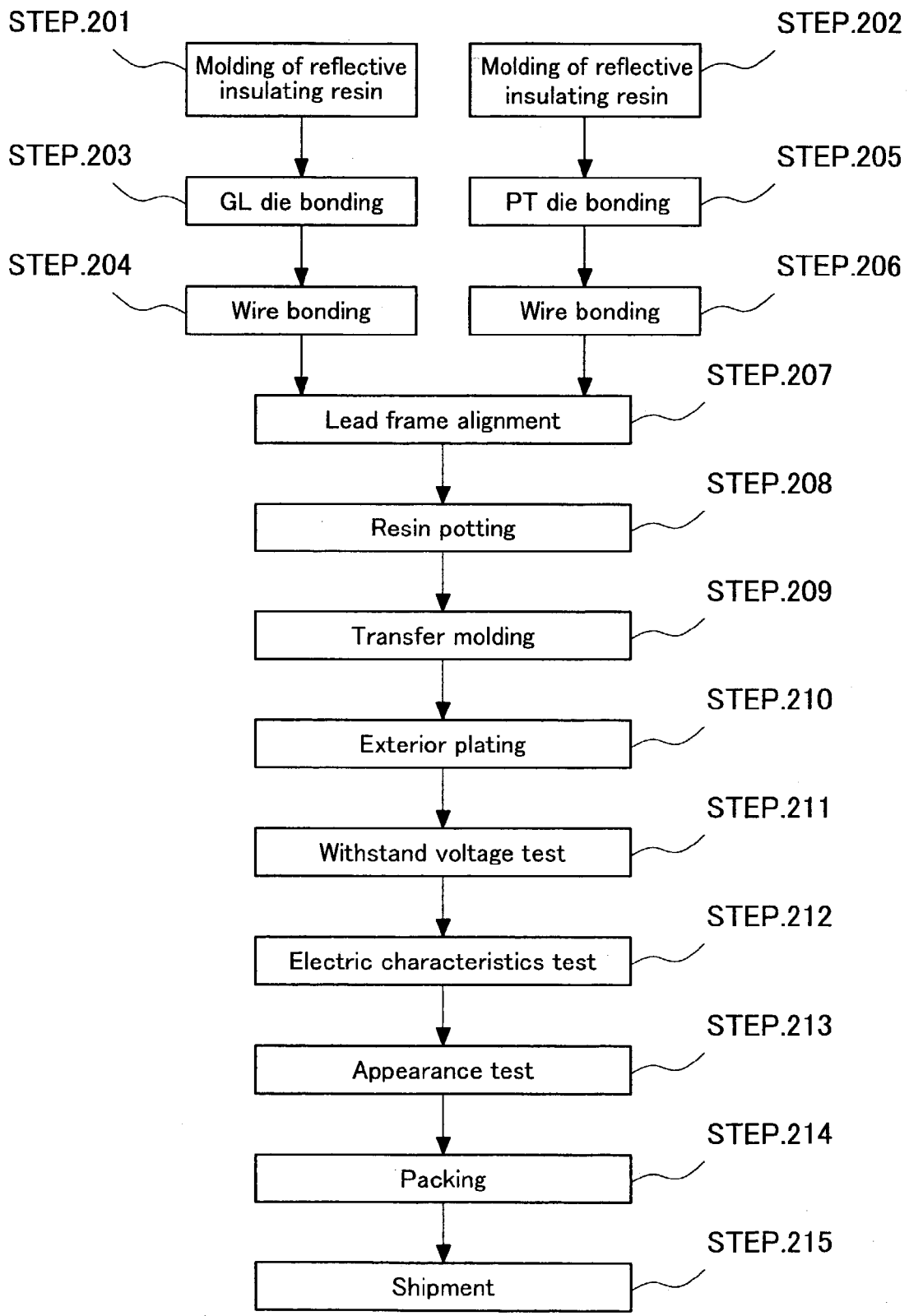
FIG. 7 is a flowchart showing a production process for the photocoupler shown in FIG. 6.

FIG. 6 is a sectional view showing a face-to-face type photocoupler according to the second embodiment of the present invention. FIG. 7 is a flowchart showing a production process for the photocoupler of this embodiment.

Figure 8:
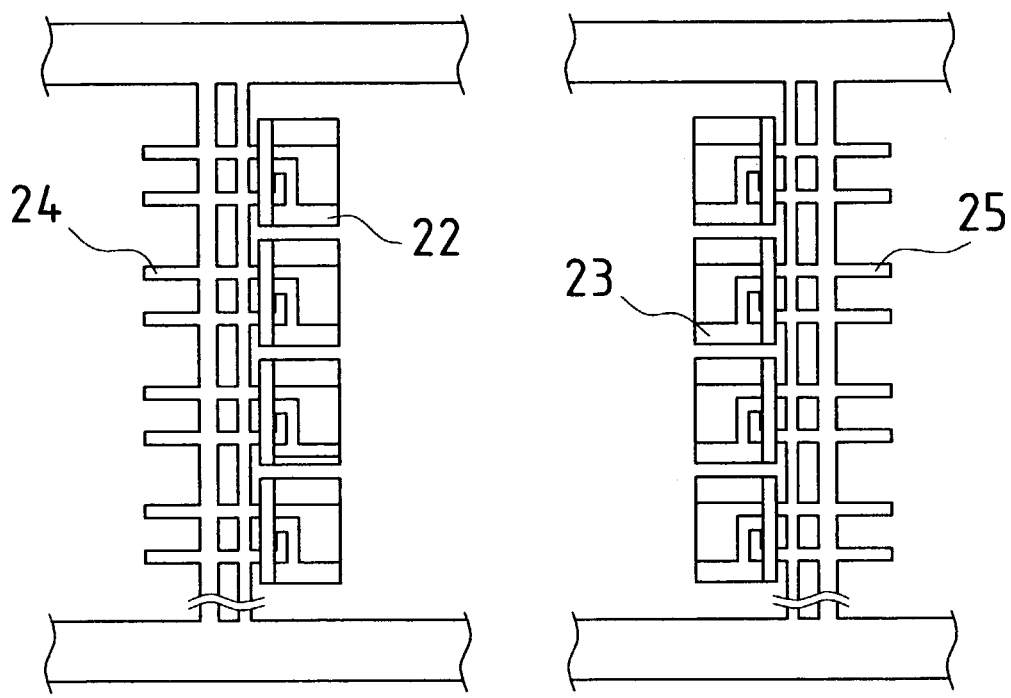
FIG. 8 is a plan view showing retention frames and lead frames for the photocoupler shown in FIG. 6.
Figure 9:
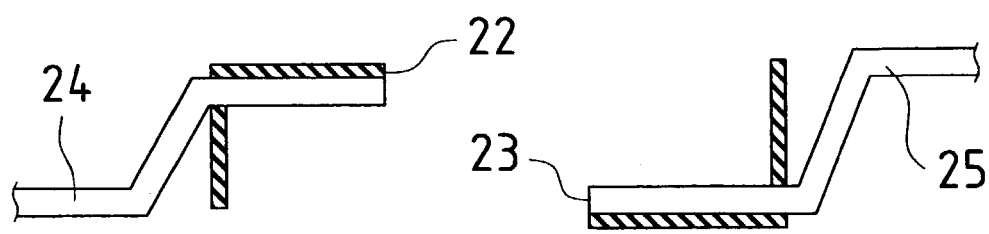
FIG. 9 is an enlarged side view of retention frames and lead frames shown in FIG. 8.

To start with, retention frames 22, 23 are molded from a light-reflective insulating resin and are respectively attached to lead frames 24, 25 as shown in FIG. 8 and FIG. 9 (STEP. 201, STEP. 202). The retention frames 22, 23 may be built into the corresponding lead frames 24, 25 during their molding process; otherwise, the retention frames 22, 23 may be prepared in advance and attached later. For this embodiment, plural pairs of retention frames 22, 23 are molded in advance and attached later. When the retention frames 22, 23 are molded from a light-reflective insulating resin, the walls 22a, 23a of the retention frames 22, 23 may be smoothed and mirror finished. As the insulating resin for the retention frames 22, 23, this embodiment adopts a thermoplastic resin. Use of a thermoplastic resin hampers development of flashes on the retention frames 22, 23, thereby eliminating a cause for defective products.

Then, a light emitting element 26 is attached to the lead frame 24 by a conductive adhesive 27 (STEP. 203) and electrically connected to the lead frame 24 by wire bonding via a wire 28a (STEP. 204). Likewise, a light detecting element 29 is attached to a lead frame 25 by a conductive adhesive 27 (STEP. 205) and electrically connected to the lead frame 25 by wire bonding via a wire 28b (STEP. 206).

Further, the lead frames 24, 25 are positioned such that the light emitting element 26 and the light detecting element 29 are opposed to each other (STEP. 207). In this opposed state, a prescribed amount of transparent resin, such as a silicone resin or an epoxy potting resin, is applied to the interior of the retention frames 22, 23, whereby the light emitting element 26 and the light detecting element 29 are enclosed in a transparent resin 30 which serves as an optical transmission path between the light emitting element 26 and the light detecting element 29 (STEP. 208). At this stage, the retention frames 22, 23 hold an unhardened transparent resin 30 and prevent it from flowing along the reverse side or terminals of the lead frames 24, 25 beyond the retention frames 22, 23.

Thereafter, a light blocking resin 31 is molded in order to avoid penetration of extraneous light and leakage of internal light (STEP. 209). An exterior wall of the molded light blocking resin 31 is plated (STEP. 210) to finish a photocoupler 21. This photocoupler 21 is tested for withstand voltage (STEP. 211), electric characteristics (STEP. 212) and appearance (STEP. 213). Having passed these tests, the photocoupler 21 is packed (STEP. 214) and shipped (STEP. 215).

In this photocoupler 21, when light emits from the light emitting element 26, the light is transmitted straight through the transparent resin 30 to the light detecting element 29. In addition, since the retention frames 22, 23 are made of a light-reflective insulating resin, light emanating sideways from the light emitting element 26 is reflected at the wall 22a of the retention frame 22, thereby also being incident on the light detecting element 29. Owing to this structure, a greater amount of light is incident on the light detecting element 29, which leads to improvement in the light transmission efficiency between the light emitting element 26 and the light detecting element 29. Furthermore, if the wall 22a of the retention frame 22 is mirror finished as mentioned earlier, the reflectance at the wall 22a becomes higher, which contributes to a further improvement in light transmission efficiency.

According to the second embodiment thus described, the retention frames 22, 23 hold an un-hardened transparent resin 30 and prevent it from flowing along the reverse side or terminals of the lead frames 24, 25 beyond the retention frames 22, 23. As a result, it is possible to form the transparent resin 30 easily and to stabilize the characteristics and quality of the photocoupler 21. Moreover, since a thermoplastic resin is employed as a material for the retention frames 22, 23, the retention frames 22, 23 are less likely to develop flashes. Eventually, it is possible to eliminate a cause for defective products.

Incidentally, the retention frames 22, 23 are attached to the lead frames 24, 25, before the light emitting element 26 and the light detecting element 29 are mounted on the lead frames 24, 25. In this case, attachment of the retention frames 22, 23 does not impose a thermal or mechanical stress on the elements 26, 29 and the wires 28a, 28b. This process can remove another cause for defective products.

Figure 10:
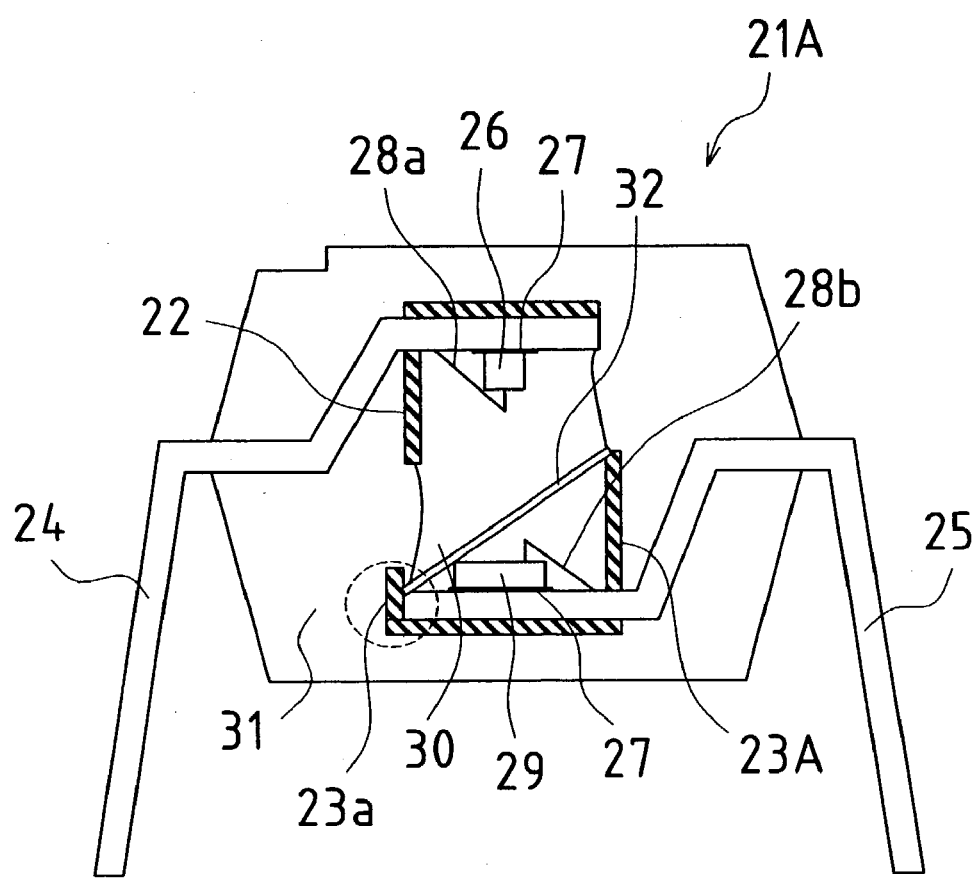
FIG. 10 is a sectional view showing a modified example of the photocoupler shown in FIG. 6.

FIG. 10 shows a modified example of the photocoupler of FIG. 6. The photocoupler 21A adopts a retention frame 23A, in place of the retention frame 23 illustrated in FIG. 6. The retention frame 23A has a riser 23a which projects from an edge of the L-shaped body. A transparent sheet 32 is stretched between the top of the L-shaped body and the extreme end of the riser 23a. This transparent sheet 32, if conductive, can suppress generation of noise (can enhance the noise resistance). Besides, if insulative, the sheet 32 can enhance the insulation between the light emitting element 26 and the light detecting element 29.

Figure 11:
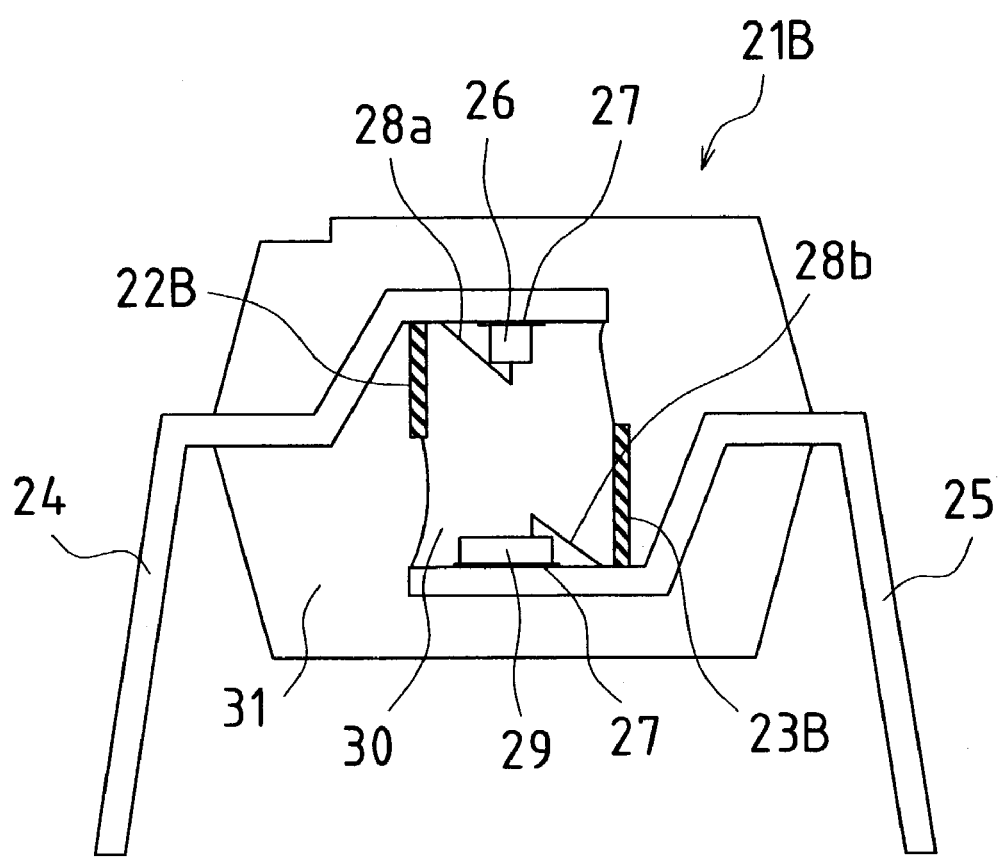
FIG. 11 is a sectional view showing another modified example of the photocoupler shown in FIG. 6.
Figure 12:
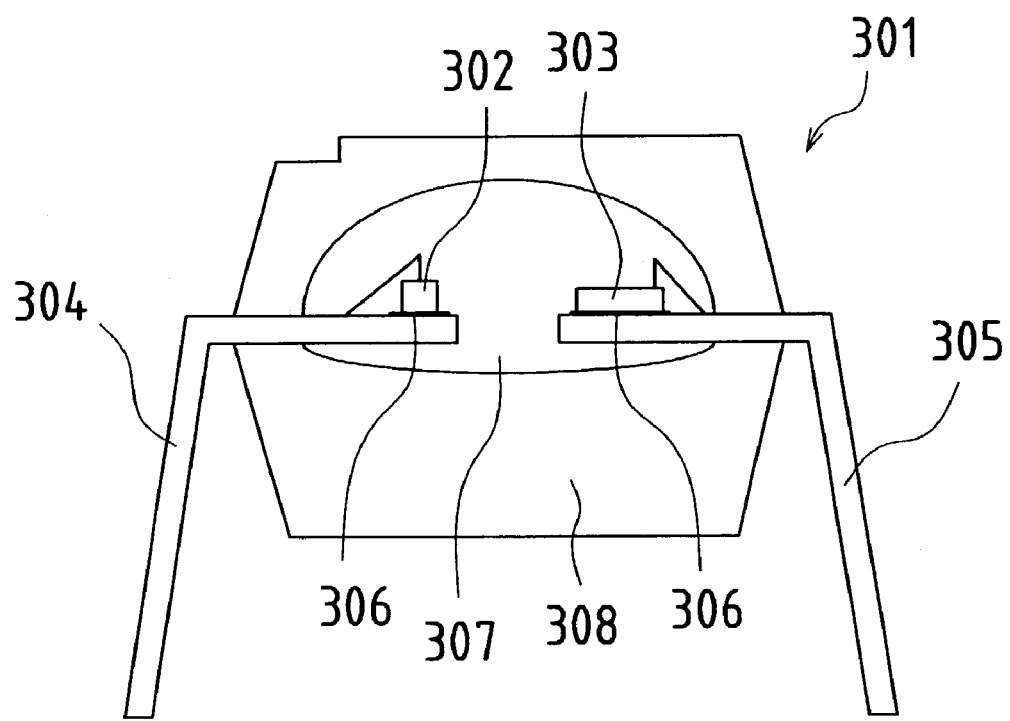
FIG. 12 is a sectional view showing a conventional flat type photocoupler.
Figure 13:
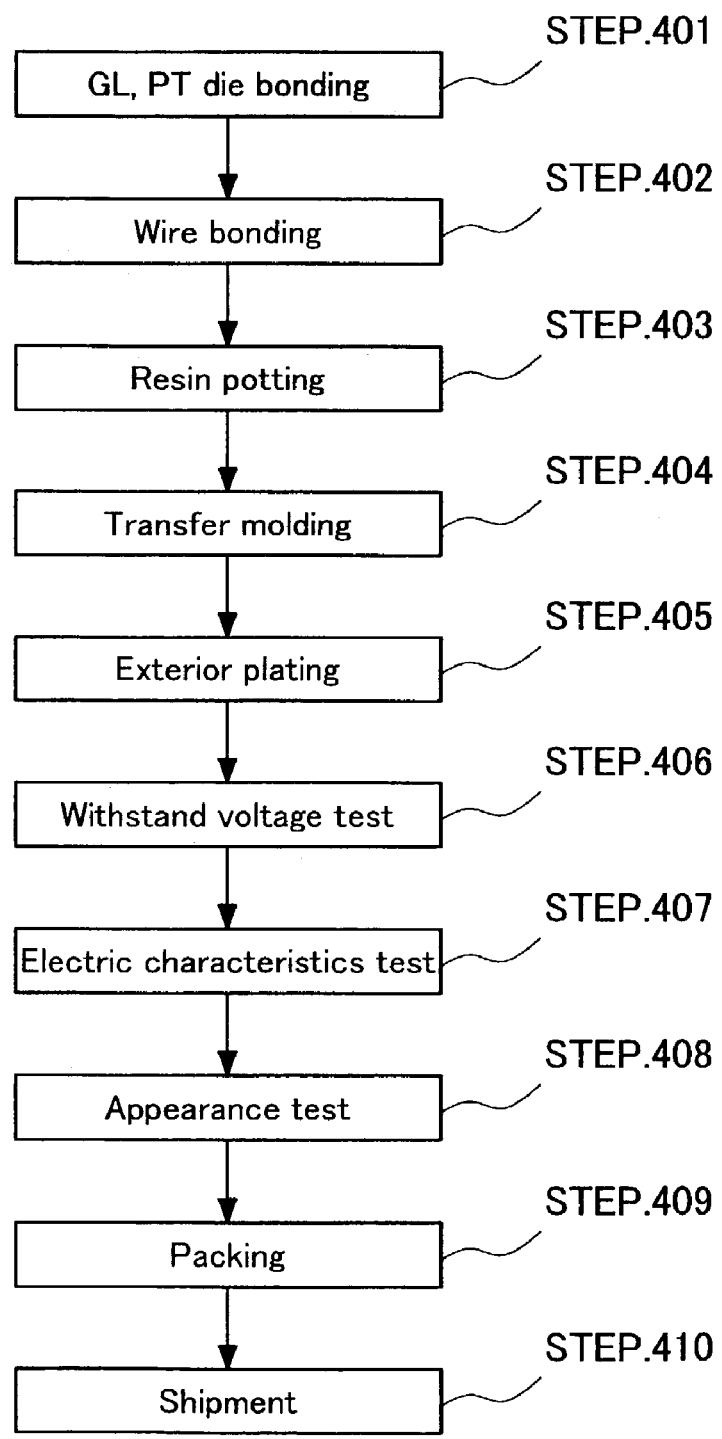
FIG. 13 is a flowchart showing a production process for the photocoupler shown in FIG. 12.
Figure 14:
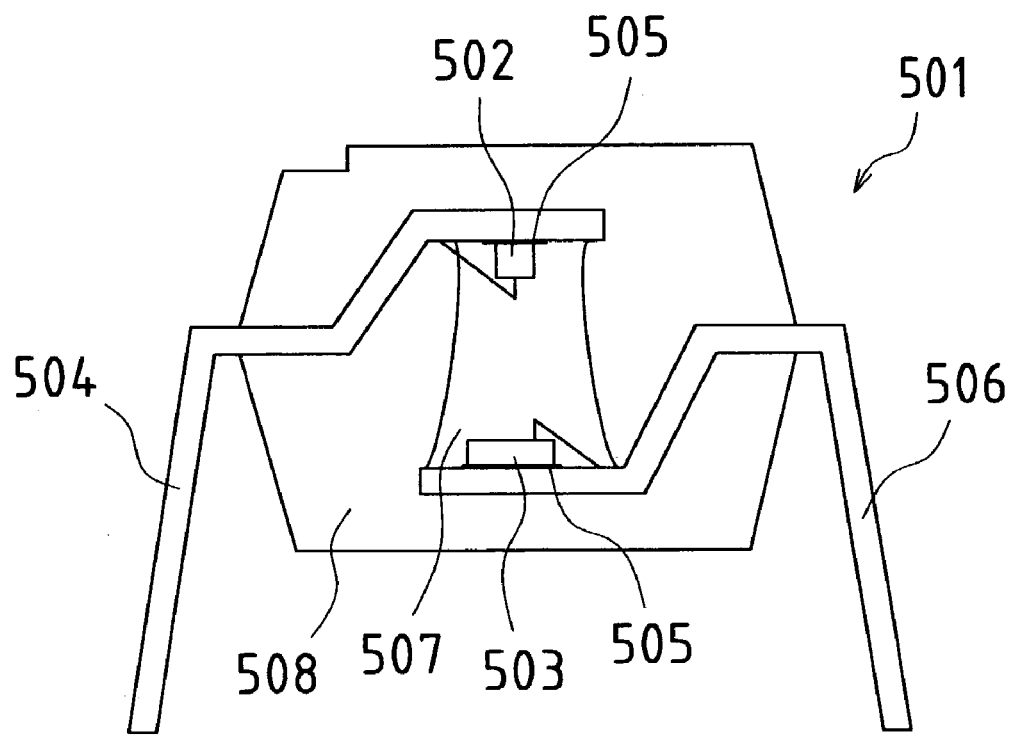
FIG. 14 is a sectional view showing a conventional face-to-face type photocoupler.
Figure 15:
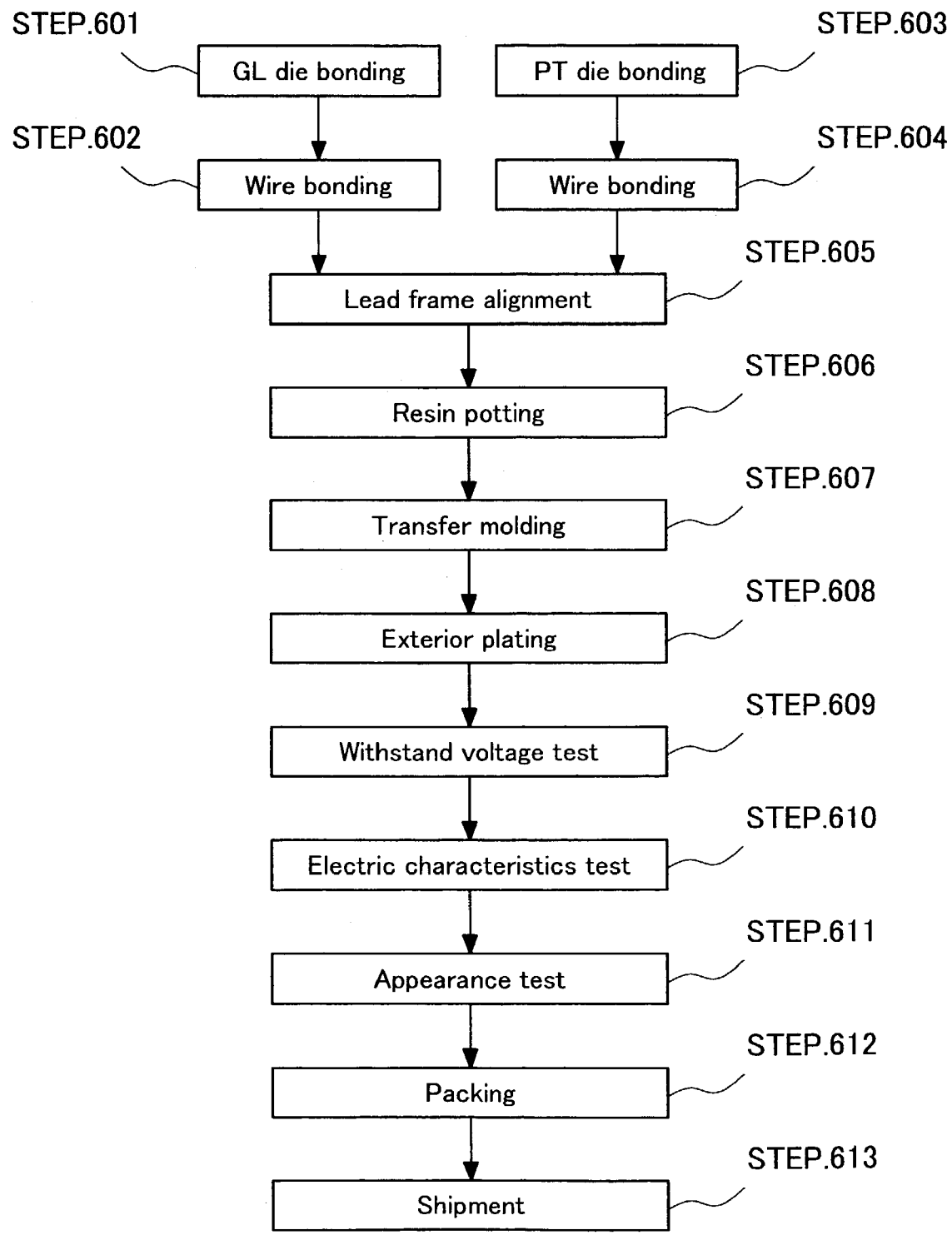
FIG. 15 is a flowchart showing a production process for the photocoupler shown in FIG. 14.

FIG. 11 shows another modified example of the photocoupler of FIG. 6. The photocoupler 21B adopts retention frames 22B, 23B, in place of the retention frames 22, 23 illustrated in FIG. 6. These retention frames 22B, 23B have a flat plate-like shape and project from the lead frames 24, 25, respectively. The retention frames 22B, 23B of such a simple shape are still capable of holding an un-hardened transparent resin 30.

The invention may be embodied in other specific forms without departing from the spirit or essential characteristics thereof. The above embodiments are therefore to be considered in all respects as illustrative and not restrictive. To give a specific example, each retention frame may be optionally altered in shape, material, etc. Further, the present invention is not limited to a photocoupler and its production method, but also encompasses an electronic device equipped with this photocoupler. Such an electronic device may be a power source, a programming console, etc.

The scope of the invention is indicated by the appended claims rather than by the foregoing description. All changes which come within the meaning and range of equivalency of the claims are therefore intended to be embraced therein.

This application is based on Patent Application No. 2002-086471 filed in Japan, the contents of which are incorporated hereinto by reference. Likewise, the contents of all references cited herein are incorporated hereinto by reference.

What is claimed is:

1. A photocoupler comprising:
   a light emitting element and a light detecting element which are both mounted on surfaces, of respective lead frames and enclosed in a transparent resin such that the transparent resin serves as an optical transmission path between the light emitting element and the light detecting element,
   the photocoupler being equipped with a retention frame for holding the transparent resin, the retention frame is disposed around the light emitting element and the light detecting element located in a package, wherein the retention frame has a shoulder for preventing outflow of the transparent resin which is in a low-viscosity state.

2. The photocoupler according to claim 1, wherein the retention frame is made of a thermoplastic resin.

3. The photocoupler according to claim 1, wherein the retention frame is made of a light-reflective insulating resin and has a reflective or mirror-like wall.

4. A photocoupler comprising a light emitting element and a light detecting element which are mounted on separate lead frames, positioned in an opposed manner in the mounted state, and enclosed in a transparent resin such that the transparent resin serves as an optical transmission path between the light emitting element and the light detecting element, the lead frames being equipped with a pair of retention frames for holding the transparent resin, wherein one of the retention frames is disposed around the light emitting element and the other retention frame is disposed around the light detecting elements, wherein a transparent sheet is interposed between the light emitting element and the light detecting element, and is supported by either of the retention frames.

5. The photocoupler according to claim 4, wherein each of the retention frames is made of a thermoplastic resin.

6. The photocoupler according to claim 4, wherein each of the retention frames is made of a light-reflective insulating resin and has a reflective or mirror-like wall.

7. The photocoupler according to claim 4, wherein the retention frames are L-shaped and surround the light emitting element and the light detecting element in a virtual rectangle.

8. A photocoupler comprising:

a light emitting element and a light detecting element which are mounted on separate lead frames, positioned in an opposed manner in the mounted state, and enclosed in a transparent resin such that the transparent resin serves as an optical transmission path between the light emitting element and the light detecting element, the lead frames being equipped with a pair of retention frames for holding the transparent resin, the retention frames being located in a package one of the retention frames is disposed around the light emitting element and the other retention frame is disposed around the light detecting element, each retention frame has a horizontal portion and a vertical portion extending from the horizontal portions, wherein a transparent sheet is interposed between the light emitting element and the light detecting element, and is supported by either of the retention frames.

9. The photocoupler according to claim 8, wherein each of the retention frames is made of a thermoplastic resin.

10. The photocoupler according to claim 8, wherein each of the retention frames is made of a light-reflective insulating resin and has a reflective or mirror-like wall.

11. The photocoupler according to claim 8, wherein the retention frames are L-shaped and surround the light emitting element and the light detecting element in a virtual rectangle.

* * * * *